(12) United States Patent
Kim et al.

(10) Patent No.: US 7,923,372 B2
(45) Date of Patent: *Apr. 12, 2011

(54) METHOD FOR FABRICATING SEMICONDUCTOR DEVICE

(75) Inventors: Young-Jun Kim, Kyoungki-do (KR); Sang-Wook Park, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 755 days.

This patent is subject to a terminal disclaimer.

(21) Appl. No.: 11/647,769

(22) Filed: Dec. 29, 2006

(65) Prior Publication Data

US 2007/0202705 A1 Aug. 30, 2007

(30) Foreign Application Priority Data

Feb. 27, 2006 (KR) .................. 10-2006-0018731

(51) Int. Cl.
*H01L 21/311* (2006.01)
*H01L 21/461* (2006.01)
*H01L 21/302* (2006.01)

(52) U.S. Cl. ........ 438/696; 438/494; 438/689; 438/692; 438/693; 438/697; 438/703; 438/706; 438/707; 438/710; 438/717; 438/736; 438/738; 438/740; 438/761; 438/763

(58) Field of Classification Search .................. 438/494, 438/692, 696, 697, 703, 706, 735, 736, 738, 438/740, 763, 689, 693, 707, 710, 717, 761
See application file for complete search history.

(56) References Cited

U.S. PATENT DOCUMENTS

| | | | | |
|---|---|---|---|---|
| 5,294,563 A | * | 3/1994 | Rao | 438/448 |
| 5,413,678 A | * | 5/1995 | Hossain | 438/757 |
| 6,063,688 A | | 5/2000 | Doyle | |
| 6,248,643 B1 | * | 6/2001 | Hsieh et al. | 438/424 |
| 6,835,662 B1 | * | 12/2004 | Erhardt et al. | 438/689 |
| 6,872,647 B1 | * | 3/2005 | Yu et al. | 438/585 |
| 6,955,961 B1 | * | 10/2005 | Chung | 438/241 |
| 7,087,533 B2 | * | 8/2006 | Chung | 438/720 |
| 7,118,955 B2 | * | 10/2006 | Amon et al. | 438/238 |
| 7,202,174 B1 | * | 4/2007 | Jung et al. | 438/694 |
| 2004/0127034 A1 | | 7/2004 | Chung | |

(Continued)

FOREIGN PATENT DOCUMENTS

| | | |
|---|---|---|
| CN | 1385889 | 12/2002 |
| JP | 2000-049112 | 2/2000 |
| KR | 2003-0096660 | 12/2003 |

*Primary Examiner* — Nadine G Norton
*Assistant Examiner* — Christopher M Remavege
(74) *Attorney, Agent, or Firm* — Blakely, Sokoloff, Taylor & Zafman LLP (57) ABSTRACT

A method for fabricating a semiconductor device includes forming a plurality of etch mask patterns over an etch target layer, each of the etch mask patterns including a first hard mask, a first pad layer, and a second pad layer, forming spacers on both sidewalls of the etch mask patterns, the spacers including a material substantially the same as that of the first pad layer, forming a second hard mask over the resulting substrate structure until gaps between the etch mask patterns are filled, the second hard mask including a material different from that of the first hard mask but substantially the same as that of the second pad layer, planarizing the second hard mask until the first pad layer is exposed, removing the first pad layer and the spacers, and etching the etch target layer using the remaining first and second hard masks as an etch barrier layer.

14 Claims, 8 Drawing Sheets

U.S. PATENT DOCUMENTS

2005/0075052 A1* 4/2005 Kim et al. .................. 451/41
2005/0142497 A1* 6/2005 Ryou et al. ................ 430/311
2005/0142734 A1* 6/2005 Shin .......................... 438/253
2005/0142867 A1* 6/2005 Park et al. ................. 438/657
2006/0252191 A1* 11/2006 Kammler et al. ........... 438/197
2007/0072437 A1* 3/2007 Brennan et al. ............. 438/761
2007/0077524 A1* 4/2007 Koh et al. .................. 430/314

\* cited by examiner

METHOD FOR FABRICATING SEMICONDUCTOR DEVICE

CROSS-REFERENCE TO RELATED APPLICATIONS

The present invention claims priority of Korean patent application number 10-2006-0018731, filed on Feb. 27, 2006, which is incorporated by reference in its entirety.

BACKGROUND OF THE INVENTION

The present invention relates to a semiconductor fabrication technology, and more particularly, to a method for forming fine patterns of a semiconductor device with a line width of less than 50 nm.

Existing exposure equipment used to fabricate a semiconductor device cannot form a pattern with a line width of less than 60 nm because of its limitation. Meanwhile, a double exposure technique is used to form a pattern with a line width of less than 60 nm. In the double exposure technique, however, a develop inspection critical dimension variation occurs during a secondary exposure process according to overlay values. When assuming that a develop inspection critical dimension variation specification is less than ±5 nm in a 50-nm technology, an overlay control capability must be less than ±5 nm. However, the existing technology cannot achieve it. After a secondary exposure process, a photoresist pattern profile is also poor. To solve this limitation, a spacer is used to reduce a pattern size.

FIGS. 1A to 1D illustrate cross-sectional views showing a method for forming fine patterns of a typical semiconductor device using a spacer to reduce a pattern size.

Figure 1A:
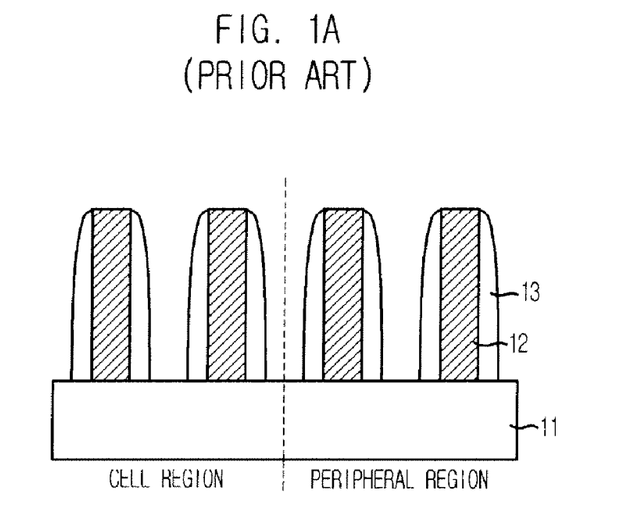
FIGS. 1A to 1D illustrate cross-sectional views showing a method for forming fine patterns of a typical semiconductor device.
Figure 1B:
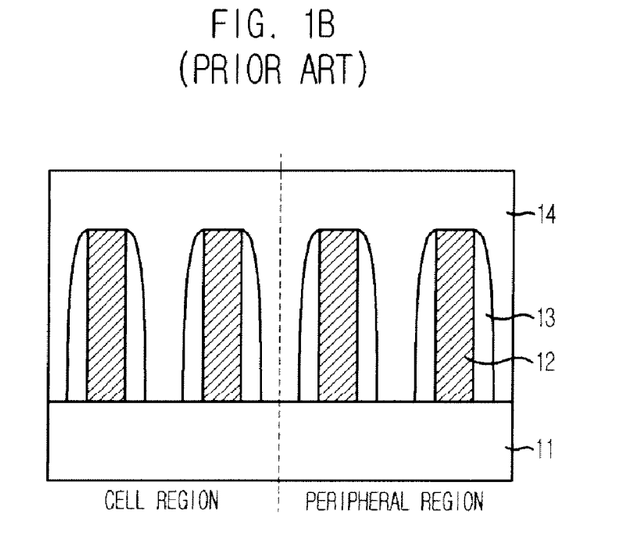

Referring to FIG. 1A, an etch target layer 11 is formed over a semiconductor substrate (not shown) defining a cell region and a peripheral region. First oxide layers 12 with a width of approximately 80 nm are formed over the etch target layer 11. A gap between the first oxide layers 12 is approximately 100 nm. Nitride spacers 13 with a width of approximately 10 nm are formed on sidewalls of the first oxide layers 12. Referring to FIG. 1B, a second oxide layer 14 is deposited to cover the nitride spacers 13, so that the gap between the nitride spacers 13 is filled.

Figure 1C:
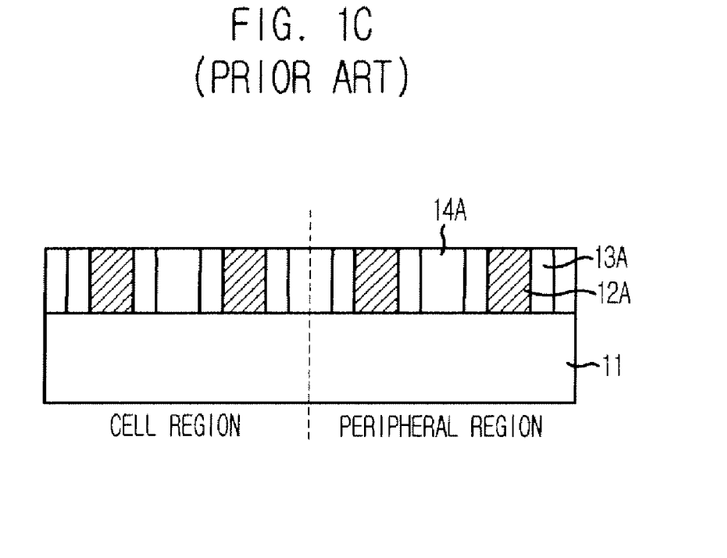
Figure 1D:
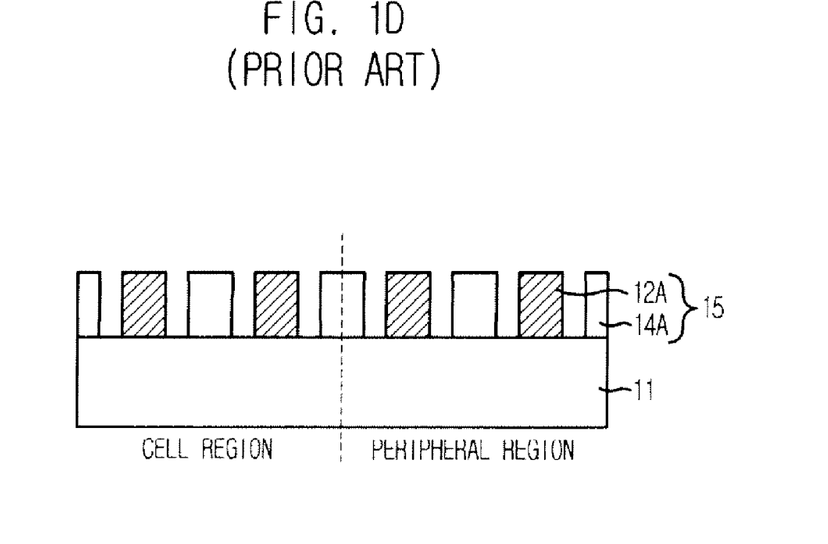

Referring to FIG. 1C, a chemical mechanical polishing (CMP) process is performed to polish the first and second oxide layers 12 and 14 and the nitride spacers 13, forming etched first oxide layers 12A, etched nitride spacers 13A, and etched second oxide layers 14A. Referring to FIG. 1D, the etched nitride spacers 13A are removed using phosphoric acid. Consequently, a hard mask 15 for patterning the etch target layer 11 to a line width of less than 50 nm is formed. The hard mask 15 is configured with the etched first oxide layers 12A and the etched second oxide layers 14A.

Figure 2:
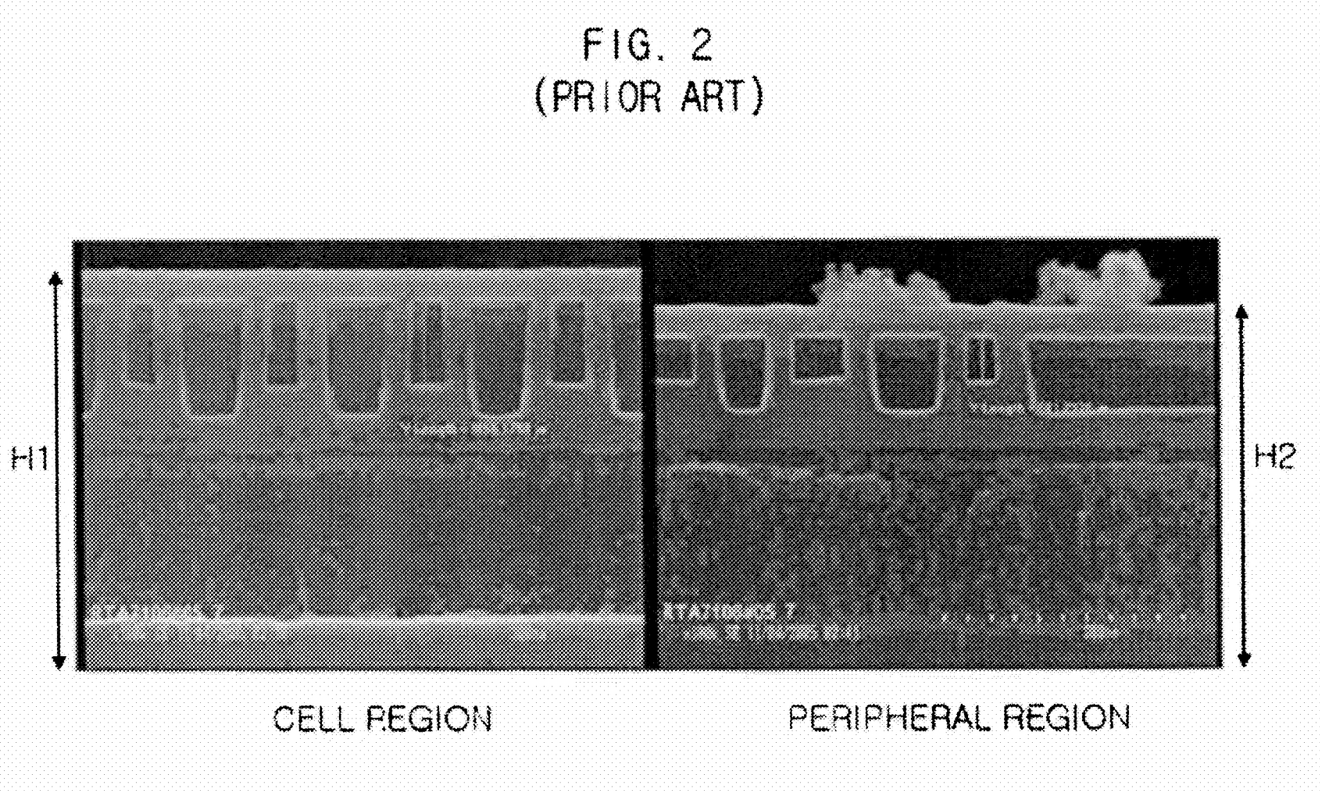
FIG. 2 illustrates scanning electron microscope (SEM) micrographs of a cell region and a peripheral region after forming fine patterns of a typical semiconductor device.

However, the typical method for forming the fine patterns of the semiconductor device may have the following limitation. As illustrated in FIG. 1C, planarization between the cell region and the peripheral region may become non-uniform during the CMP process performed after the deposition of the second oxide layer 14. That is, because the CMP process is performed on the homogeneous oxide layers such as the first and second oxide layers 12 and 14, the control of the polishing process may become difficult so that uniform layers cannot be formed. This limitation is also shown in FIG. 2. As illustrated, after the CMP process, a thickness H1 of the cell region is approximately 1,056 Å and a thickness H2 of the peripheral region is approximately 561 Å. Thus, planarization between the cell region and the peripheral region may become non-uniform.

SUMMARY OF THE INVENTION

Embodiments of the present invention are directed to provide a method for fabricating a semiconductor device, which can minimize non-uniformity occurring during a chemical mechanical polishing (CMP) process in a fine pattern formation process using spacers.

Other embodiments of the present invention are directed to provide a semiconductor device having fine patterns formed stably with a pattern size of less than approximately 50 nm.

In accordance with an aspect of the present invention, there is provided a method for fabricating a semiconductor device, including: forming a plurality of etch mask patterns over an etch target layer, each of the etch mask patterns including a first hard mask, a first pad layer, and a second pad layer; forming spacers on both sidewalls of the etch mask patterns, the spacers including a material substantially the same as that of the first pad layer; forming a second hard mask over the resulting substrate structure until gaps between the etch mask patterns are filled, the second hard mask including a material different from that of the first hard mask but substantially the same as that of the second pad layer; planarizing the second hard mask until the first pad layer is exposed; removing the first pad layer and the spacers; and etching the etch target layer using the remaining first and second hard masks as an etch barrier layer.

In accordance with another aspect of the present invention, there is provided a method for fabricating a semiconductor device, including: forming a plurality of etch mask patterns over an etch target layer, each of the etch mask patterns comprising a first hard mask, a first pad layer, and a second pad layer; forming spacers on both sidewalls of the etch mask patterns, the spacers including a material substantially the same as that of the first pad layer; forming a second hard mask over the resulting substrate structure until gaps between the etch mask patterns are filled, the second hard mask including a material different from that of the first hard mask but substantially the same as that of the second pad layer; planarizing the second hard mask until the second pad layer is exposed; etching the second pad layer and a portion of the second hard mask until the first pad layer is exposed; removing the first pad layer and the spacers; and etching the etch target layer using the remaining first and second hard masks as an etch barrier layer.

DESCRIPTION OF SPECIFIC EMBODIMENTS

FIGS. 3A to 3F illustrate cross-sectional views showing a method for fabricating a semiconductor device in accordance with an embodiment of the present invention.

Figure 3A:
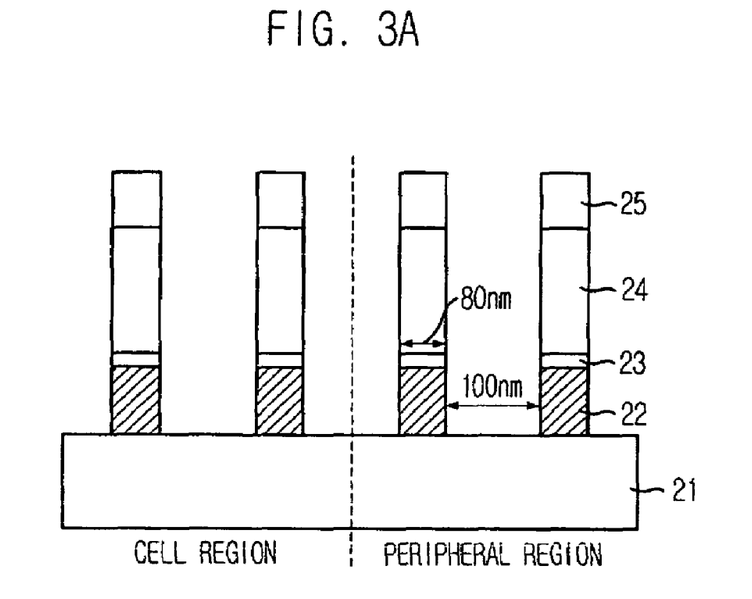
FIGS. 3A to 3F illustrate cross-sectional views showing a method for forming fine patterns of a semiconductor device in accordance with an embodiment of the present invention.

Referring to FIG. 3A, a semiconductor substrate (not shown) defining a cell region and a peripheral region is prepared. An etch target layer 21 is formed over the semiconductor substrate. A plurality of etch mask patterns including a first hard mask layer 22, a first pad layer 23, and a second pad layer 24 are formed over the etch target layer 21. The first hard mask layer 22, the first pad layer 23, and the second pad layer 24 include polysilicon, a nitride-based material, and an oxide-based material, respectively. Thus, the first hard mask layer 22, the first pad layer 23, and the second pad layer 24 are referred to as the polysilicon layer 22, the nitride layer 23, and the first oxide layer 24 hereinafter. The polysilicon layer 22 is formed of doped polysilicon with phosphorus concentration of approximately $5 \times 10^{19}$ atoms/cm$^3$. For example, the polysilicon layer 22 is formed to a thickness of approximately 300 Å to approximately 1,000 Å using silane ($SiH_4$) gas at a temperature of approximately 510° C. to approximately 590° C. and a pressure of approximately 10 mTorr to approximately 90 mTorr for approximately 30 minutes to approximately 90 minutes. A flow rate of $SiH_4$ is approximately 50 sccm to approximately 150 sccm. In addition, before forming the polysilicon layer 22, a stabilization process is performed on a deposition chamber for approximately 4 minutes to approximately 6 minutes. At this time, the stabilization process is performed for a ramp-up time of approximately 5° C./min and a ramp-down time of approximately 5° C./min.

The nitride layer 23 is formed to a thickness of approximately 100 Å to approximately 1,000 Å using nitrogen ($N_2$) gas by a low pressure chemical vapor deposition (LP-CVD) process at a temperature of approximately 710° C. to approximately 800° C. and a pressure of approximately 10 mTorr to approximately 90 mTorr for approximately 20 minutes to approximately 50 minutes. A flow rate of $N_2$ is approximately 5 sccm to approximately 100 sccm. In another method, the nitride layer 23 is formed to a thickness of approximately 100 Å to approximately 1,000 Å using a mixed gas of $SiH_4$ and ammonia ($NH_3$) gas by a plasma enhanced CVD (PE-CVD) process at a temperature of approximately 300° C. to approximately 800° C. and a pressure of approximately 4 mTorr to approximately 9 mTorr for approximately 20 minutes to approximately 50 minutes. A flow rate of $SiH_4$ is approximately 5 sccm to approximately 100 sccm. In addition, before forming the nitride 23, a stabilization process is performed on a deposition chamber for approximately 2 minutes to approximately 4 minutes. At this time, the stabilization process is performed for a ramp-up time of approximately 5° C./min and a ramp-down time of approximately 5° C./min.

The first oxide layer 24 is formed to a thickness of approximately 100 Å to approximately 1,000 Å using a tetra ethyl ortho silicate (TEOS) gate and oxygen ($O_2$) gas as a source gas at a temperature of approximately 300° C. to approximately 800° C. and a pressure of approximately 4 mTorr to approximately 9 mTorr. A flow rate of the TEOS gas is approximately 5 sccm to approximately 500 sccm and a deposition rate is approximately 100 Å/sec. In addition, before forming the first oxide layer 24, a stabilization process is performed on a deposition chamber for approximately 2 minutes to approximately 4 minutes. At this time, the stabilization process is performed for a ramp-up time of approximately 5° C./min and a ramp-down time of approximately 5° C./min.

Photoresist patterns 25 are formed over the first oxide layer 24. The first oxide layer 24, the nitride layer 23, and the polysilicon layer 22 are etched using the photoresist patterns 25 as an etch barrier layer.

The etching of the first oxide layer 24 is performed using a mixed gas of tetrafluoromethane ($CF_4$), fluoroform ($CHF_3$), and $O_2$ at a chamber pressure of approximately 4 mTorr to approximately 20 mTorr in radio frequency plasma of approximately 400 W to approximately 800 W. At this time, a flow rate of $CF_4$ is approximately 100 sccm to approximately 200 sccm, a flow rate of $CHF_3$ is approximately 100 sccm to approximately 400 sccm, and a flow rate of $O_2$ is approximately 300 sccm to approximately 400 sccm.

The etching of the nitride layer 23 is performed using a mixed gas of $CF_4$, $CHF_3$, and $O_2$ at a chamber pressure of approximately 10 mTorr to approximately 30 mTorr in radio frequency plasma of approximately 400 W to approximately 800 W. At this time, a flow rate of $CF_4$ is approximately 100 sccm to approximately 200 sccm, a flow rate of $CHF_3$ is approximately 100 sccm to approximately 400 sccm, and a flow rate of $O_2$ is approximately 300 sccm to approximately 400 sccm.

The etching of the polysilicon layer 22 is performed using a mixed gas of chlorine ($Cl_2$), $O_2$, hydrogen bromide (HBr), and argon (Ar) at a chamber pressure of approximately 4 mTorr to approximately 20 mTorr in radio frequency plasma of approximately 400 W to approximately 800 W. At this time, a flow rate of $Cl_2$ is approximately 100 sccm to approximately 200 sccm, a flow rate of $O_2$ is approximately 100 sccm to approximately 200 sccm, a flow rate of HBr is approximately 100 sccm to approximately 400 sccm, and a flow rate of Ar is approximately 300 sccm to approximately 400 sccm. The stack structure of the first oxide layer 24, the nitride layer 23, and the polysilicon layer 22 has a width of approximately 80 nm and the gap between the patterns is approximately 100 nm.

Figure 3B:
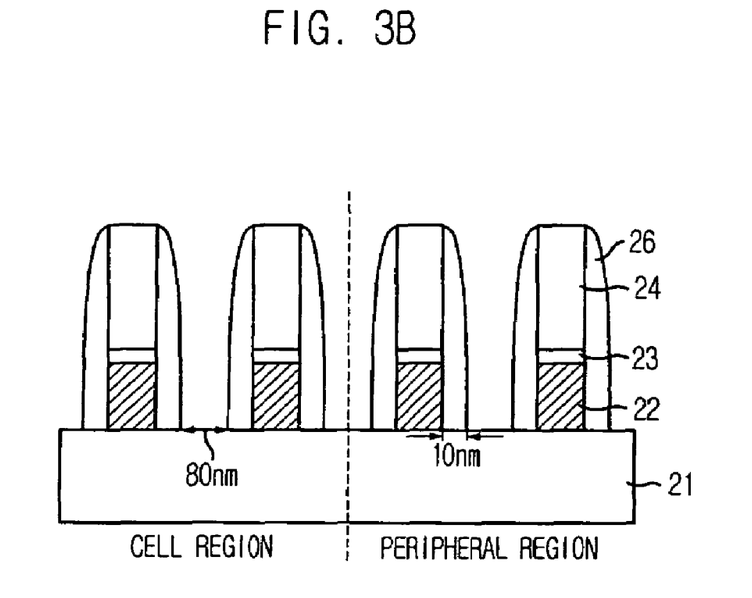

Referring to FIG. 3B, the photoresist patterns 25 are removed, and nitride layers for spacers are deposited over the semiconductor substrate including the stack structure of the first oxide layer 24, the nitride layer 23, and the polysilicon layer 23. The nitride layers are etched back to form nitride spacers 26 with a width of approximately 10 nm on sidewalls of the stack structure. In one method, the nitride layers for spacers are formed to a thickness of approximately 100 Å to approximately 500 Å by an LP-CVD process having an $N_2$ flow rate of approximately 5 sccm to approximately 100 sccm, a deposition temperature of approximately 710° C. to approximately 800° C., a chamber pressure of approximately 10 mTorr to approximately 90 mTorr, a deposition time of approximately 20 minutes to approximately 50 minutes, a stabilization time of approximately 2 minutes to approximately 4 minutes, a ramp-up time of approximately 5° C./min, and a ramp-down time of approximately 5° C./min. In another method, the nitride layers for spacers are formed to a thickness of approximately 100 Å to approximately 500 Å by an PE-CVD process having a mixed gas of $SiH_4$ and $NH_3$ with a flow rate of approximately 5 sccm to approximately 100 sccm, a deposition temperature of approximately 300° C. to approximately 800° C., a chamber pressure of approximately 4 mTorr to approximately 9 mTorr, a deposition rate of approximately 100 Å/sec, for a stabilization time of approximately 2 minutes to approximately 4 minutes, a ramp-up time of approximately 5° C./min, and a ramp-down time of approximately 5° C./min. The etching-back of the nitride layers for spacers is performed using a mixed gas of $CF_4$, $CHF_3$, and $O_2$ at a chamber pressure of approximately 10 mTorr to approximately 30 mTorr in a radio frequency plasma of approximately 400 W to approximately 800 W, wherein the CF$_4$ flows at a rate ranging from approximately 100 sccm to approximately 200 sccm, the CHF$_3$ flows at a rate ranging from approximately 100 sccm to approximately 400 sccm, and the O$_2$ flows at a rate ranging from approximately 300 sccm to approximately 400 sccm, thereby forming the nitride spacers 26.

Figure 3C:
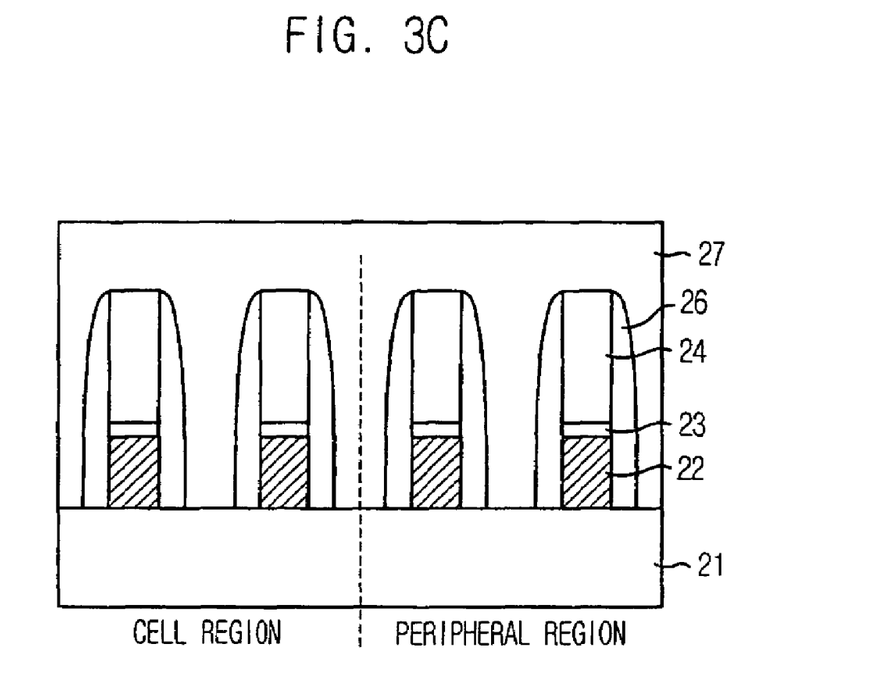

Referring to FIG. 3C, a second hard mask layer 27 is formed over the semiconductor substrate including the nitride spacers 26. Since the second hard mask layer 27 includes an oxide-based material, the second hard mask layer 27 is referred to as the second oxide layer 27 hereinafter. At this time, the gap between the stack structures of the first oxide layer 24, the nitride layer 23, and the polysilicon layer 22 is filled with the second oxide layer 27. The second oxide layer 27 is formed of high density plasma (HDP) oxide. For example, the second oxide layer 27 is formed to a thickness of approximately 1,500 Å to approximately 4,000 Å using a source gas of SiH$_4$, O$_2$, and helium (He) with a flow rate of approximately 50 sccm to approximately 500 sccm at a deposition temperature of approximately 600° C. to approximately 800° C., a process pressure of approximately 4 mTorr to approximately 9 mTorr, a deposition rate of approximately 50 Å/sec to approximately 100 Å/sec, a stabilization time of approximately 2 minutes to approximately 4 minutes, a ramp-up time of approximately 5° C./min, and a ramp-down time of approximately 5° C./min.

Figure 3D:
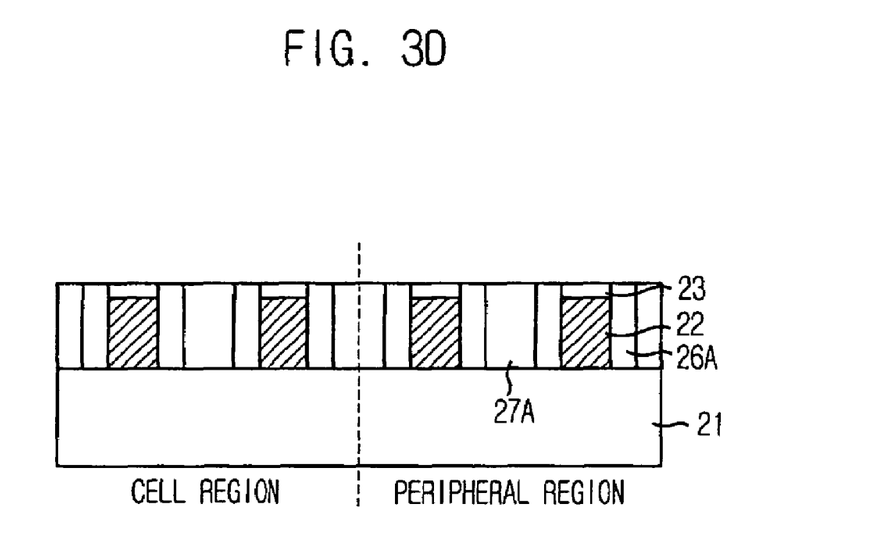

Referring to FIG. 3D, a first planarization process is performed on the substrate including the second oxide layer 27 to selectively planarize the first oxide layer 24 and the second oxide layer 27. The first planarization process is a CMP process using a low selectivity slurry (LSS). The CMP process using the low selectivity slurry uses a fumed silica with pH of approximately 10 to approximately 14 and a slurry amount of approximately 150 mL/min to approximately 250 mL/min.

Then, a second planarization process is performed using the nitride layer 23 as a planarization stop layer. The second planarization process is a CMP process using a high selectivity slurry (HSS). The CMP process using the high selectivity slurry uses cerium dioxide (CeO$_2$) with pH of approximately 6 to approximately 8. A selectivity ratio of the first oxide layer 24 to the nitride layer 23 ranges approximately 50-100:1. At this time, the nitride layer 23 is etched by a thickness of approximately 20 Å to approximately 200 Å. The nitride layer 23 is used as a planarization stop layer for uniform planarization of the cell region and the peripheral region. Reference denotations 26A and 27A refer to etched nitride spacers and an etched second oxide layer, respectively.

Figure 3E:
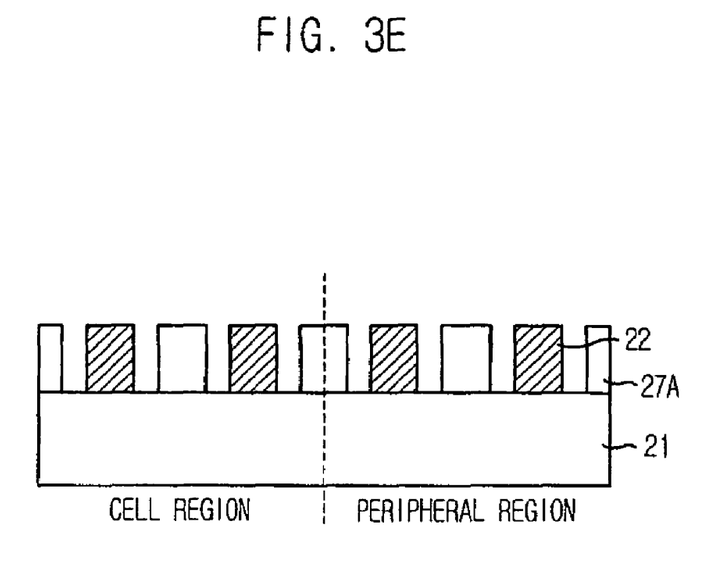

Referring to FIG. 3E, a wet etching process using phosphoric acid is performed to remove the nitride layer 23 and the etched nitride spacers 26. The removing of the nitride layer 23 and the etched nitride spacers 26 includes a H$_3$PO$_3$ cleaning process having a cleaning time of approximately 10 minutes to approximately 30 minutes and a hot-SC1 (NH$_4$OH:H$_2$O$_2$:H$_2$O) cleaning process having a cleaning time of approximately 5 minutes to approximately 30 minutes. The polysilicon layer 22 disposed under the nitride layer 23 is not lost by the wet etching process.

Figure 3F:
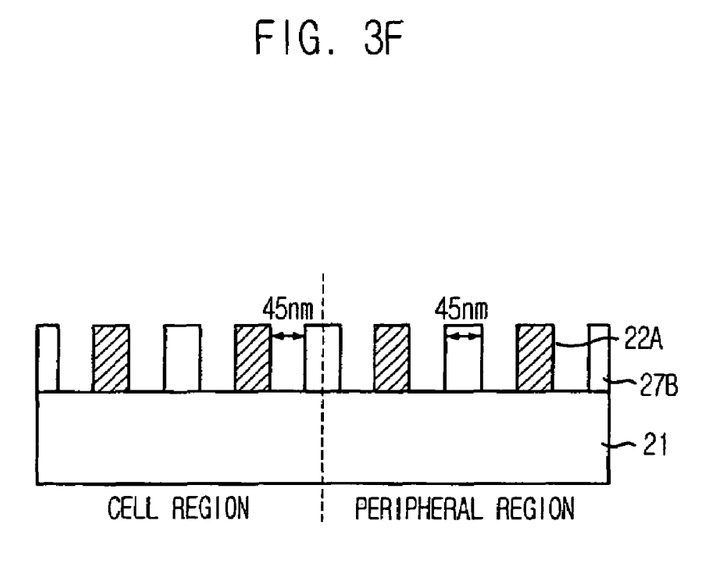

Referring to FIG. 3F, the widths of the polysilicon layer 22 and the etched second oxide layer 27A, functioning as final hard mask patterns for patterning the etch target layer 21, are adjusted by performing the hot-SC1 cleaning process on the resultant substrate structure. Reference denotations 22A and 27B refer to an adjusted polysilicon layer and an adjusted second oxide layer, respectively.

Figure 4A:
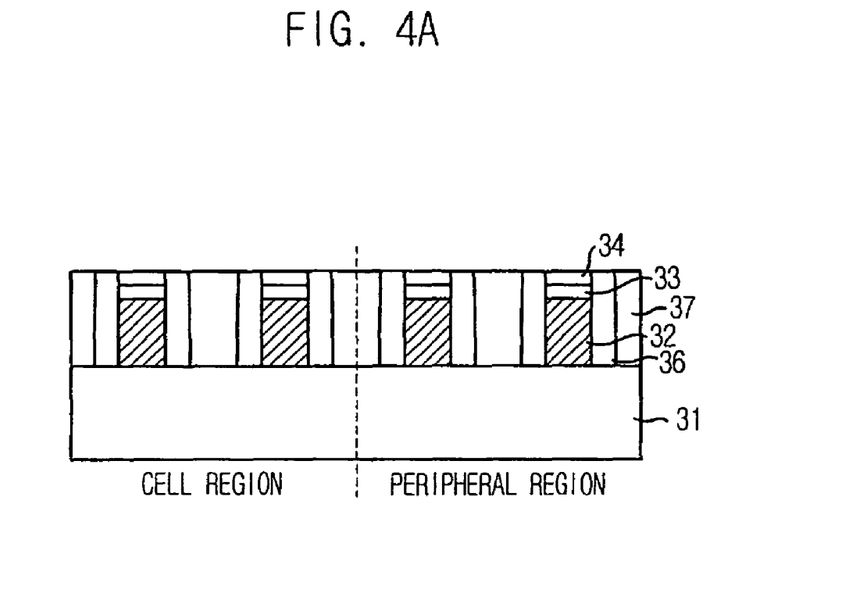
FIGS. 4A and 4B illustrate cross-sectional views showing a method for forming fine patterns of a semiconductor device in accordance with another embodiment of the present invention.
Figure 4B:
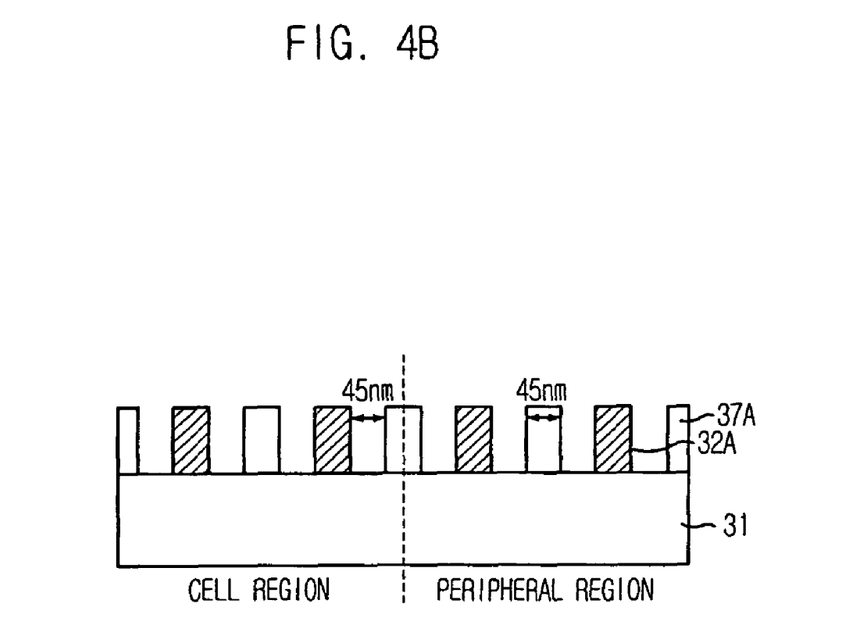

FIGS. 4A and 4B illustrate cross-sectional views showing a method for forming fine patterns of a semiconductor device in accordance with another embodiment of the present invention.

Referring to FIG. 4A, after processes substantially the same as the processes shown in FIGS. 3A to 3C are performed, a planarization process is performed on a substrate structure to selectively remove a first oxide layer 34 and the second oxide layer 37. At this time, the planarization process is a CMP process using a low selectivity slurry. The planarization is performed through a CMP process using a fumed silica with pH of approximately 10 to approximately 14 and a slurry of approximately 150 mL/min to approximately 250 mL/min. Reference denotations 31, 32, 33, and 36 refer to an etch target layer, a polysilicon layer, a nitride layer, and spacers, respectively.

Referring to FIG. 4B, the remaining first oxide layer 34, a nitride layer 33 and spacers 36 are removed in-situ using buffered oxide etchant (BOE) and phosphoric acid. The BOE is a mixed solution of hydrogen fluoride (HF) and NH$_4$F. The removing of the first oxide layer 34 is performed in the BOE for a cleaning time of approximately 5 minutes to approximately 30 minutes, and the removing of the spacers 36 and the nitride layer 33 is performed in the phosphoric acid solution for a cleaning time of approximately 10 minutes to approximately 30 minutes. The widths of the polysilicon layer 32 and the second oxide layer 37, functioning as final hard mask patterns for patterning the etch target layer 31, are adjusted by performing the hot-SC1 cleaning process on the resultant substrate structure. Reference denotations 32A and 37A refer to an adjusted polysilicon layer and an adjusted second oxide layer, respectively.

Figure 5:
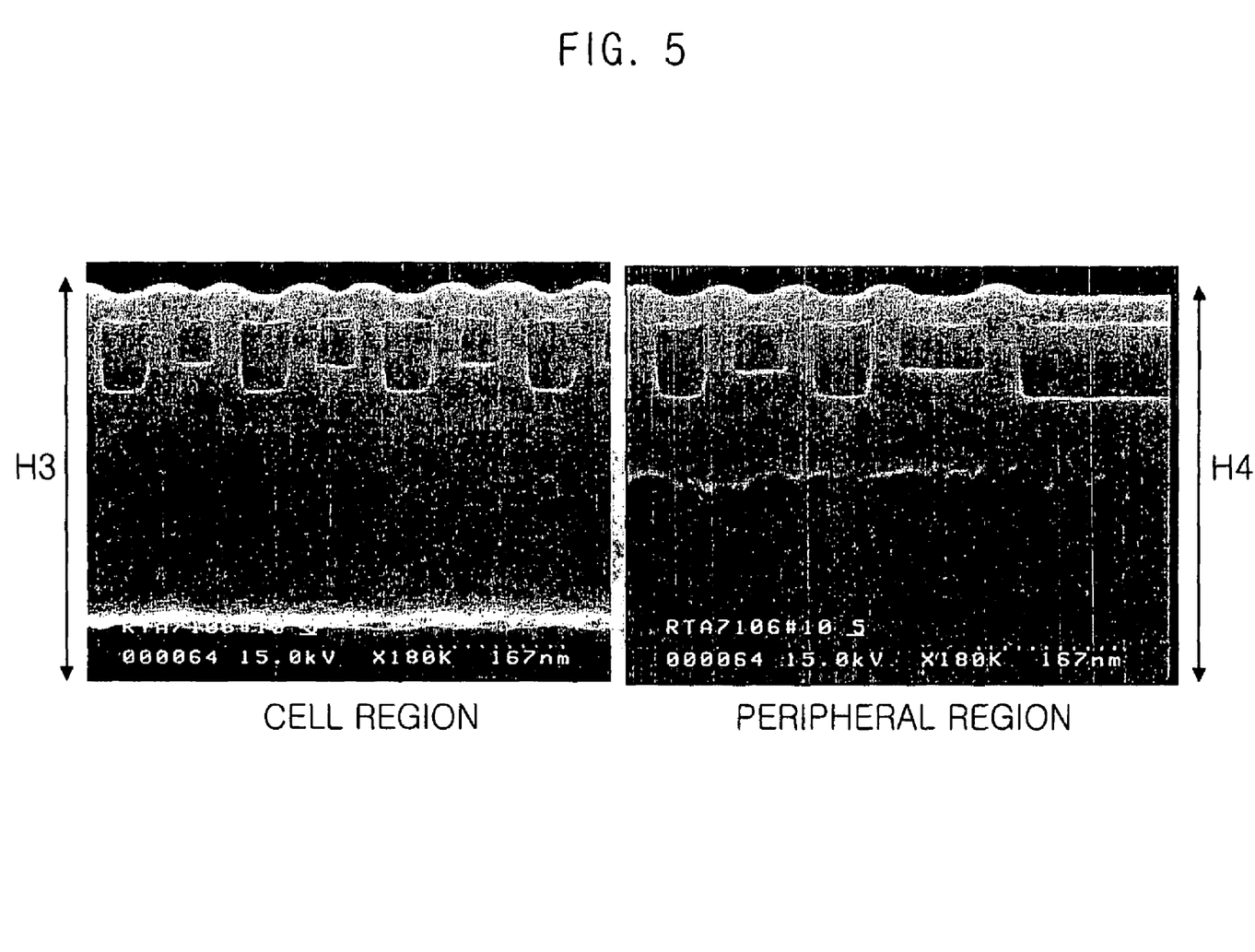
FIG. 5 illustrates SEM micrographs of the fine patterns of the semiconductor device in accordance with the embodiments of the present invention.

FIG. 5 illustrates SEM micrographs of the fine patterns of the semiconductor device in accordance with the embodiments of the present invention. A thickness H3 of the cell region is approximately 519 Å, and a thickness H4 of the peripheral region is approximately 496 Å. Thus, the cell region and the peripheral region are planarized relatively uniformly.

In forming the hard masks for the cell region and the peripheral region, a hard mask having the stack structure of oxide layer/nitride layer/polysilicon layer, not a monolayer hard mask, is formed. In one embodiment, the cell region and the peripheral region are uniformly planarized using the nitride layer as the planarization stop layer. In another embodiment, the cell region and the peripheral region are uniformly planarized by removing the nitride layer using the phosphoric acid. The polysilicon layer is not affected in removing the nitride layer. Therefore, the hard mask for pattern size of less than 50 nm can be obtained.

As described above, the hard mask for fine patterns is formed by patterning the preliminary hard mask having a multi-layer structure. Therefore, when the hard mask is applied to a process of forming gate lines, the process margin can be secured and the manufacturing cost can be reduced. In addition, a device with a desired line width can be obtained. Therefore, the reliability and stability of the semiconductor device can be secured.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a semiconductor device, comprising:
   forming a plurality of etch mask patterns over an etch target layer, each of the etch mask patterns including a first hard mask, a first pad layer, and a second pad layer stacked over the etch target layer;
   forming spacers on both sidewalls of the etch mask patterns, the spacers including a material substantially the same as that of the first pad layer;
   forming a second hard mask over the resulting structure until gaps between the etch mask patterns are filled, the second hard mask including a material different from that of the first hard mask but substantially the same as that of the second pad layer;
   performing a first planarization process onto the resultant structure in a manner that a portion of the second pad layer remains and a portion of the second hard mask and a portion of the spacer are removed;
   performing a second planarization process onto the resultant structure using the first pad layer as a planarization stop layer in a manner that a portion of the remaining second hard mask is removed;
   removing the first pad layer and the remaining spacers; and
   etching the etch target layer using the remaining first and second hard masks as an etch barrier layer.

2. The method of claim 1, wherein the second pad layer comprises one of an oxide-based layer and a high density plasma (HDP) oxide layer, and the first pad layer comprises a nitride-based layer.

3. The method of claim 1, wherein the first planarization process is performed by a chemical mechanical polishing (CMP) process using a low selectivity slurry, and the second planarization process is performed by a CMP process using a high selectivity slurry.

4. The method of claim 3, wherein the CMP process using the low selectivity slurry is performed using a fumed silica with pH ranging from approximately 10 to approximately 14 and a slurry ranging from approximately 150 mL/min to approximately 250 mL/min, and the CMP process using the high selectivity slurry is performed using cerium dioxide ($CeO_2$) with pH ranging from approximately 6 to approximately 8 and a selectivity ratio of the second pad layer to the first pad layer ranging approximately 50-100:1.

5. The method of claim 1, wherein the first hard mask comprises a polysilicon layer and the second hard mask comprises an oxide-based layer.

6. The method of claim 1, wherein the removing of the first pad layer and the spacers comprises performing a cleaning process using phosphoric acid ($H_3PO_4$) for approximately 10 minutes to approximately 30 minutes, and a hot-SC1 ($NH_4OH:H_2O_2:H_2O$) cleaning process performed for approximately 5 minutes to approximately 30 minutes.

7. The method of claim 2, wherein the nitride-based layer is etched to a thickness ranging from approximately 20 Å to approximately 200 Å.

8. A method for fabricating a semiconductor device, comprising:
   forming a plurality of etch mask patterns over an etch target layer, each of the etch mask patterns comprising a first hard mask, a first pad layer, and a second pad layer stacked over the etch target layer;
   forming spacers on both sidewalls of the etch mask patterns, the spacers including a material substantially the same as that of the first pad layer;
   forming a second hard mask over the resulting substrate structure until gaps between the etch mask patterns are filled, the second hard mask including a material different from that of the first hard mask but substantially the same as that of the second pad layer;
   removing a portion of the second pad layer, a portion of the second hard mask and a portion of the spacer by a planarization process in a manner that the second pad layer remains;
   removing the remaining second pad layer, a portion of the remaining second hard mask, the first pad layer and the remaining spacers simultaneously; and
   etching the etch target layer using the remaining first and second hard masks as an etch barrier layer.

9. The method of claim 8, wherein the planarization process comprises performing a CMP process using a slurry ranging from approximately 150 mL/min to approximately 250 mL/min and a fumed silica with pH ranging from approximately 10 to approximately 14.

10. The method of claim 8, wherein the second pad layer comprises an oxide-based layer or an HDP oxide layer, and the first pad layer comprises a nitride-based layer.

11. The method of claim 8, wherein the removing of the remaining second pad layer, the portion of the remaining second hard mask, the first pad layer, and the remaining spacers is performed in-situ at substantially the same time.

12. The method of claim 8, wherein the first hard mask comprises a polysilicon layer, and the second hard mask comprises an oxide-based layer.

13. The method of claim 1, further comprising:
   before etching of the etch target layer, adjusting widths of the first hard mask and the remaining second hard mask for patterning the etch target layer.

14. The method of claim 8, further comprising:
   before etching of the etch target layer, adjusting widths of the first hard mask and the remaining second hard mask for patterning the etch target layer.

* * * * *